(12) United States Patent
Braun et al.

(10) Patent No.: US 11,508,806 B1
(45) Date of Patent: Nov. 22, 2022

(54) LOW LEAKAGE ESD MOSFET

(71) Applicant: Monolithic Power Systems, Inc., San Jose, CA (US)

(72) Inventors: Eric Braun, Mountain View, CA (US); Joel McGregor, Kirkland, WA (US)

(73) Assignee: Monolithic Power Systems, Inc., San Jose, CA (US)

( * ) Notice: Subject to any disclaimer, the term of this patent is extended or adjusted under 35 U.S.C. 154(b) by 13 days.

(21) Appl. No.: 17/326,685

(22) Filed: May 21, 2021

(51) Int. Cl.
*H01L 29/06* (2006.01)
*H01L 27/02* (2006.01)
*H01L 27/092* (2006.01)
*H01L 29/08* (2006.01)
*H01L 29/40* (2006.01)
*H01L 29/49* (2006.01)
*H01L 29/66* (2006.01)

(52) U.S. Cl.
CPC ........ *H01L 29/0607* (2013.01); *H01L 27/027* (2013.01); *H01L 27/092* (2013.01); *H01L 29/0847* (2013.01); *H01L 29/401* (2013.01); *H01L 29/4983* (2013.01); *H01L 29/6659* (2013.01)

(58) Field of Classification Search
CPC ......... H01L 27/0203–027; H01L 29/06–0619; H01L 23/58–60; H01L 29/4983; H01L 29/665–66507; H01L 29/7845; H01L 21/823418; H01L 29/66681–66704; H01L 29/7816–7826; H01L 27/0248; H01L 27/0251; H01L 27/0292; H01L 27/0925; H01L 27/0927; H01L 21/823443; H01L 21/823835; H01L 29/41725–41791; H01L 29/4933; H01L 29/4975; H01L 21/823814
See application file for complete search history.

(56) References Cited

U.S. PATENT DOCUMENTS

| | | | | |
|---|---|---|---|---|
| 5,593,909 A | * | 1/1997 | Han | ................ H01L 29/66757 257/E29.151 |
| 10,032,761 B1 | * | 7/2018 | Choppalli | ............. H01L 29/861 |
| 10,522,357 B2 | * | 12/2019 | Fukasaku | ................ H01L 29/49 |
| 2015/0054076 A1 | * | 2/2015 | Zhang | ................ H01L 29/4916 257/343 |

* cited by examiner

*Primary Examiner* — Sonya McCall-Shepard
(74) *Attorney, Agent, or Firm* — Perkins Coie LLP (57) ABSTRACT

A MOSFET fabricated in a semiconductor substrate, includes: a gate oxide region formed atop the semiconductor substrate; a gate polysilicon region formed on the gate oxide region; a source region of a first doping type formed in the semiconductor substrate and located at a first side of the gate polysilicon region; and a drain region of the first doping type formed in the semiconductor substrate and located at a second side of the gate polysilicon region. The gate polysilicon region has a first sub-region of the first doping type, a second sub-region of the first doping type, and a third sub-region of a second doping type, wherein the first sub-region is laterally adjacent to the source region, the second sub-region is laterally adjacent to the drain region, and the third sub-region is formed laterally between the first and second sub-regions.

14 Claims, 11 Drawing Sheets

FIG. 1

(PRIOR ART)

FIG. 2

(PRIOR ART)

LOW LEAKAGE ESD MOSFET

FIELD OF THE INVENTION

The present invention relates generally to integrated circuits, and more particularly but not exclusively to MOSFETs (metal oxide semiconductor field effect transistors) used for ESD (electro-static discharge) protection.

BACKGROUND OF THE INVENTION

Conventionally, ESD protection circuits are used in integrated circuit devices to protect the device from being damaged due to electro-static discharge.

Figure 1:
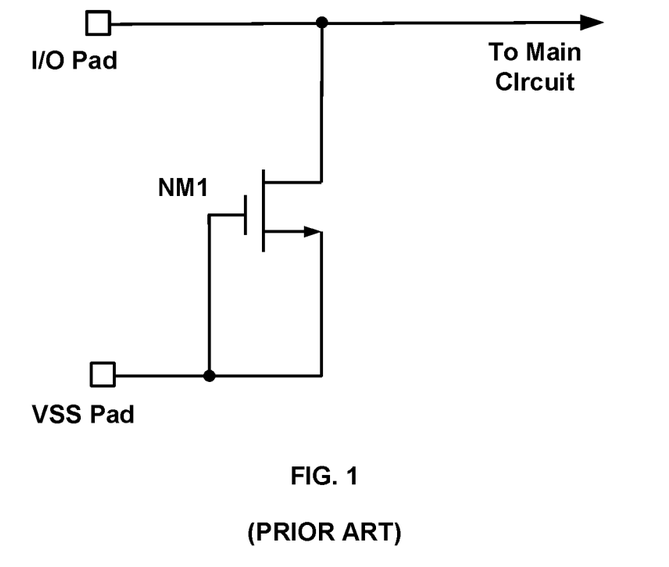
FIG. 1 illustrates a prior art ESD protection circuit with GGNMOS.
Figure 2:
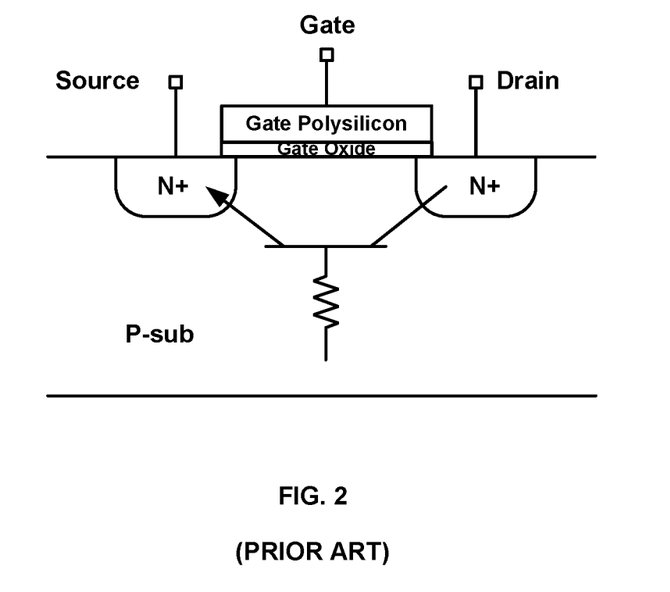
FIG. 2 illustrates a prior art semiconductor structure of the NMOS in FIG. 1.

A prior ESD protection circuit comprising an NMOS (n-type MOSFET) is illustrated in FIG. 1. The drain of the NMOS is electrically coupled to an I/O pad of an integrated circuit device, while the gate and source of the NMOS are electrically coupled to a ground pad (i.e. VSS pad). This NMOS is normally called gate-grounded NMOS (GGN-MOS). As can be seen from FIG. 2, the NMOS has a parasitic bipolar transistor formed by its drain, body and source regions. When a ESD spike shows up at the I/O pad, this parasitic bipolar transistor is turned on due to the avalanche breakdown of the drain-substrate junction, the NMOS goes into snapback mode to discharge the ESD current.

During normal operation, the NMOS of FIG. 1 is "off" and only a leakage current flows through it. This leakage current is a significant contributor to power dissipation of the integrated circuit device, thus there is a need for reducing it.

SUMMARY

In accomplishing the above and other objects, there has been provided, in accordance with an embodiment of the present invention, a MOSFET fabricated in a semiconductor substrate. The MOSFET comprises: a gate oxide region formed atop the semiconductor substrate; a gate polysilicon region formed on the gate oxide region; a source region of a first doping type formed in the semiconductor substrate and located at a first side of the gate polysilicon region; and a drain region of the first doping type formed in the semiconductor substrate and located at a second side of the gate polysilicon region. The gate polysilicon region includes a first sub-region of the first doping type, a second sub-region of the first doping type, and a third sub-region of a second doping type, wherein the first sub-region is laterally adjacent to the source region, the second sub-region is laterally adjacent to the drain region, and the third sub-region is formed laterally between the first and second sub-regions.

There has been further provided, in accordance with an embodiment of the present invention, a method for fabricating a MOSFET. The method comprises: providing a semiconductor substrate; forming a gate oxide layer atop the semiconductor substrate; forming a gate polysilicon layer on the gate oxide layer; etching the gate polysilicon layer using a first photoresist layer and a first mask, to form a gate polysilicon region; forming a second photoresist layer; patterning the second photoresist layer through a second mask to form a first opening and a second opening respectively at a first side of gate polysilicon region and a second side of the gate polysilicon region, wherein the first and second openings both expose a portion of the gate polysilicon region and a portion of the semiconductor substrate; implanting ions of a first doping type through the first and second openings, to form a source region in the semiconductor substrate, a drain region in the semiconductor substrate, a first sub-region of the gate polysilicon region laterally adjacent to the source region, and a second sub-region of the gate polysilicon region laterally adjacent to the drain region; removing the second photoresist layer; forming a third photoresist layer; patterning the third photoresist layer through a third mask to form a third opening with a location laterally between the first and second openings; implanting ions of a second doping type through the third opening, to form a third sub-region of the gate polysilicon region laterally between the first and second sub-regions; and removing the third photoresist layer.

Embodiments of the present invention are still further directed to a MOSFET for providing ESD protection in an integrated circuit device. The MOSFET comprises: a plurality of source regions and a plurality of drain regions alternatively formed in a semiconductor substrate and having a first doping type, wherein the plurality of drain regions are electrically coupled to a first pad of the integrated circuit device, the plurality of source regions are electrically coupled to a second pad of the integrated circuit device; a plurality of gate oxide regions formed atop the semiconductor substrate, wherein each of the plurality of gate oxide regions is formed laterally between a corresponding one of the plurality of source regions and a corresponding one of the plurality of drain regions; and a plurality of gate polysilicon regions, wherein each of the plurality of gate polysilicon regions is formed on a corresponding one of the plurality of gate oxide regions, and includes a first sub-region of the first doping type, a second sub-region of the first doping type, and a third sub-region of a second doping type. The first sub-region is laterally overlapped with part of the corresponding source region, the second sub-region is laterally overlapped with part of the corresponding drain region, and the third sub-region is formed laterally between the first and second sub-regions.

DESCRIPTION OF THE DRAWINGS

The present invention can be further understood with reference to following detailed description and appended drawings, wherein like elements are provided with like reference numerals. These drawings are only for illustration purpose, thus may only show part of the devices and are not necessarily drawn to scale.

DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left", "right", "in", "out", "front", "back", "up", "down", "top", "atop", "bottom", "on", "over", "under", "above", "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference. The phrase "in one embodiment", as used herein does not necessarily refer to the same embodiment, although it may. The symbols "+" and "−" when used to describe dopants or doped regions/zones are merely used to descriptively indicate relative dopant concentration levels, but not intend to specify or limit the dopant concentration ranges, nor intend to add other limitations to the dopants and doped regions/zones. For instance, both "N+ type" and "N− type" can be referred to as "N type" in more general terms, and both "P+ type" and "P− type" can be referred to as "P type" in more general terms. Those skilled in the art should understand that the meanings of the terms identified above do not necessarily limit the terms, but merely provide illustrative examples for the terms. As can be appreciated, the conductivity and doping of materials or regions disclosed herein may be varied, with appropriate changes to the conductivity and doping of other materials or regions, depending on the application.

Figure 3:
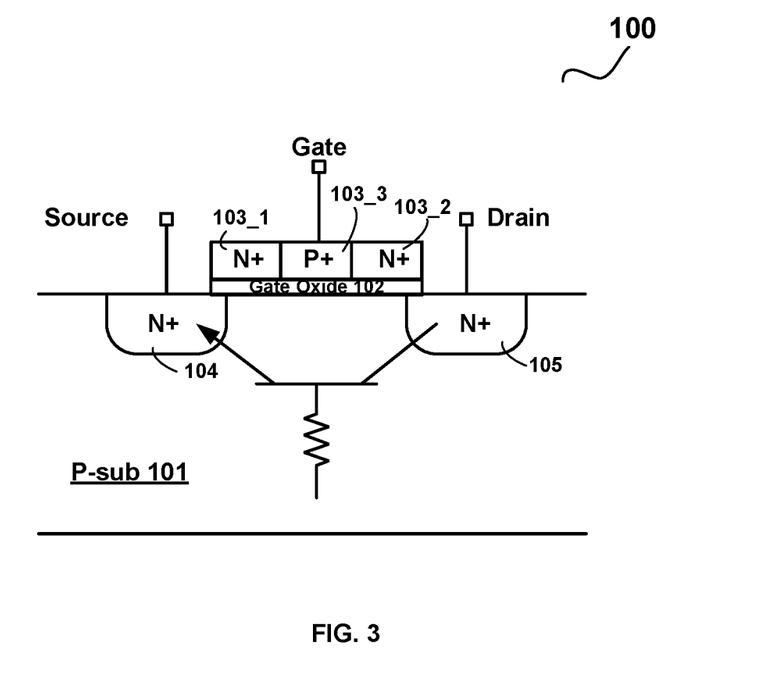
FIG. 3 illustrates a semiconductor structure of an NMOS 100 in accordance with an embodiment of the present invention.

FIG. 3 illustrates a semiconductor structure of an NMOS 100 in accordance with an embodiment of the present invention. The NMOS 100 is fabricated in a P type substrate (P-sub) 101, and includes a gate oxide region 102 formed atop the P-sub 101, a gate polysilicon region formed on the gate oxide region 102, an N+ source region 104 and an N+ drain region 105. The source region 104 and the drain region 105 are both formed in the P-sub 101, while the source region 104 located at a first side of the gate polysilicon region, and the drain region 105 is located at a second side of the gate polysilicon region.

The gate polysilicon region in NMOS 100 of FIG. 3 includes three sub-regions (103_1, 103_2, 103_3) configured as a N+/P+/N+ structure. The N+ sub-region 103_1 is laterally adjacent to the source region 104, the N+sub-region 103_2 is laterally adjacent to the drain region 105, and the P+sub-region 103_3 is formed laterally between the aforementioned two N+ sub-regions. Compared with the prior art shown in FIG. 2, the NMOS 100 of FIG. 3 has a higher threshold voltage and a much lower leakage current.

A leakage current is a drain current of a MOS transistor when the MOS is in an off state. A main contributor to the leakage current is a subthreshold current (also called weak inversion conduction current), which occurs when a gate-source voltage $V_{gs}$ of the MOS transistor is below its threshold voltage $V_{th}$. This subthreshold current $I_{sub}$ is exponentially dependent on the threshold voltage $V_{th}$, and could be expressed as:

$$I_{sub} \propto e^{q(V_{gs}-3.1\ V_{th})/KT} \times (1-e^{-qV_{ds}/KT})$$

wherein q is the elementary charge, K is the Boltzmann's constant, T is the temperature. Therefore, when the threshold voltage $V_{th}$ increases, the leakage current decreases, and vice versa.

Regarding NMOS, the threshold voltage $V_{th}$ could be expressed as:

$$V_{th} = \frac{\sqrt{4qN_a\varepsilon_s\phi_{fp}}}{C_{ox}} - \frac{Q_{ss}'}{C_{ox}} + \phi_{ns} + 2\phi_{fp}$$

Wherein $N_a$ is the acceptor concentration in the P type substrate, $\varepsilon_s$ is the permittivity of the semiconductor (e.g. Si), $\phi_{fp}$ is the difference between the intrinsic Fermi level and the Fermi level in the bulk P type substrate. $\phi_{ns}$ is the metal-semiconductor work function difference, $C_{ox}$ is the gate oxide capacitance per unit area, $Q_{ss}$ is an equivalent trapped charge per unit area located in the gate oxide region.

Figure 4A:
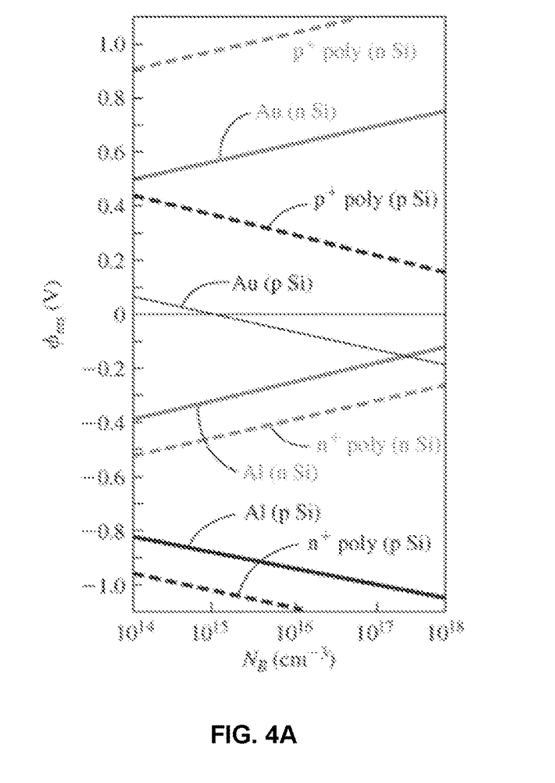
FIG. 4A illustrates metal-semiconductor work function difference versus doping for aluminum, gold, and n+ and p+ polysilicon gates.

Through configuring the gate polysilicon region as the N+/P+/N+ structure, the NMOS 100 in the embodiment of FIG. 3 could adjust its threshold voltage $V_{th}$. As shown in FIG. 4A, the metal-semiconductor work function difference $\phi_{ns}$ to P silicon is more positive for P+ polysilicon than for N+ polysilicon. Therefore, the (positive) gate voltage at which the silicon under the P+ sub-region 103_3 inverts is higher than the voltage at which the silicon under the N+ sub-regions (103_1, 103_2) invert, which means, the threshold voltage $V_{th}$ of NMOS 100 is mainly determined by the P+ sub-region 103_3. Compared with prior arts of FIG. 2, which has a whole uniformed doped (e.g. N+) gate polysilicon region, the NMOS 100 of FIG. 3 has a larger threshold voltage. Thus its subthreshold current $I_{sub}$, which is exponentially dependent on the threshold voltage $V_{th}$, is highly reduced, and so is the total leakage current.

Figure 4B:
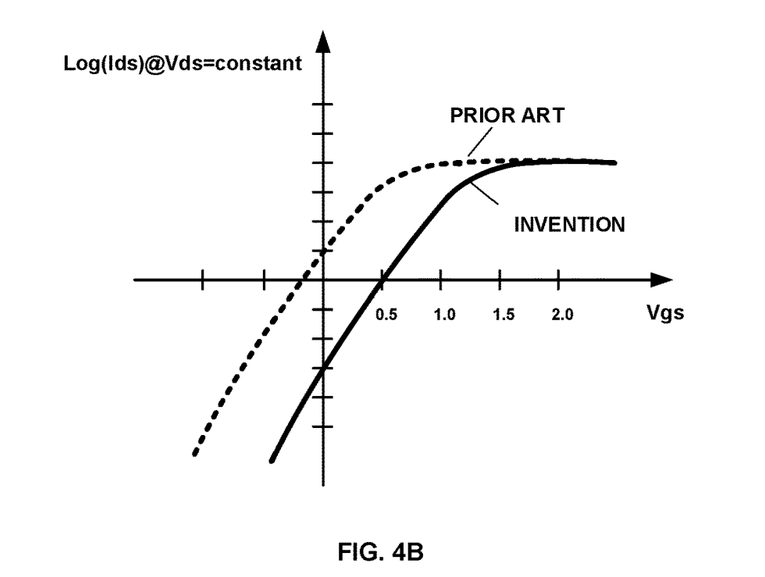
FIG. 4B shows curves of drain-source current Ids versus gate-source voltage $V_{gs}$ of an NMOS in accordance with prior art structure and the structure of embodiments of the present invention.

FIG. 4B shows curves of a drain-source current $I_{ds}$ versus a gate-source voltage $V_{gs}$ of an NMOS in accordance with prior art structure and the structure of embodiments of the present invention. The curves are shown in logarithmic scale and under constant drain-source voltage $V_{ds}$. As could be seen from FIG. 4B, the transistor off-state current, which is the drain-source current $I_{ds}$ when the gate-source voltage $V_{gs}$ is zero, is effectively lowered in the embodiments of the present invention.

In CMOS process, the aforementioned sub-regions in gate polysilicon region could be doped along with the P+ and N+ drain/source regions of MOS transistors, and no other process steps are required. Therefore, processing time and processing cost increase are at a minimal. FIGS. 5A through 5L schematically illustrate a sequential process of a method for fabricating an NMOS 200 in accordance with an embodiment of the present invention.

Figure 5A:
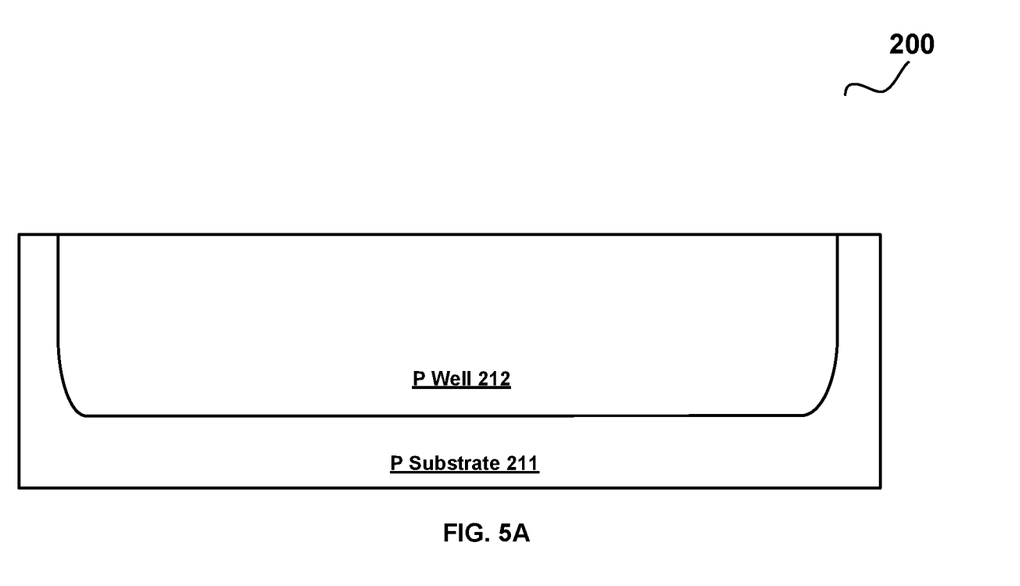
FIGS. 5A-5L illustrate an NMOS 200 at various stages of fabrication using a fabricating method in accordance with an embodiment of the present invention.

Referring to FIG. 5A, a semiconductor substrate 211 (e.g. P type as shown in the figure) with a P well 212 formed therein is provided. It could be understood that, in some embodiments, there could further be an isolation structure, such as an N+ buried layer or a deep N Well, for isolating the P well 212 from the semiconductor substrate 211. And the semiconductor substrate 211 may include a P+ silicon substrate and a P-epitaxial layer grown on it.

Figure 5B:
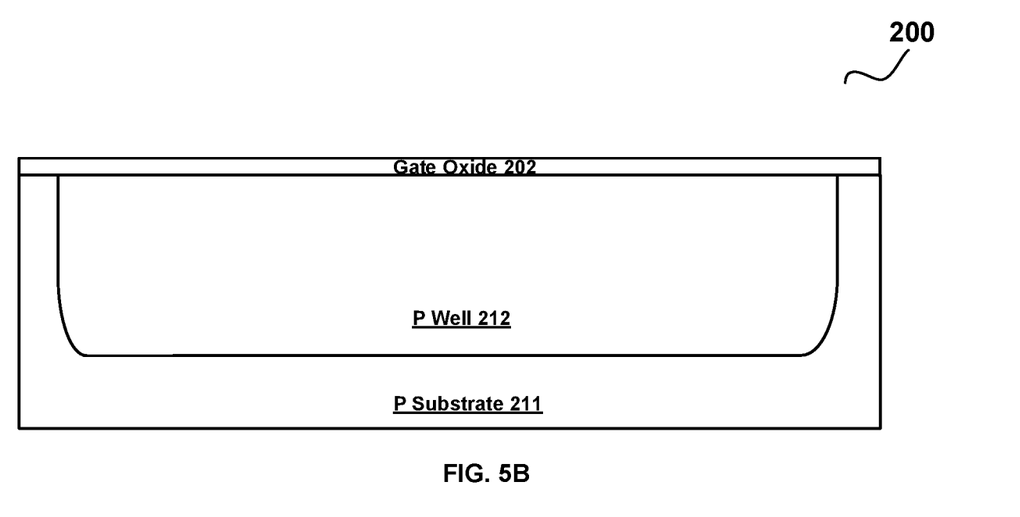
Figure 5C:
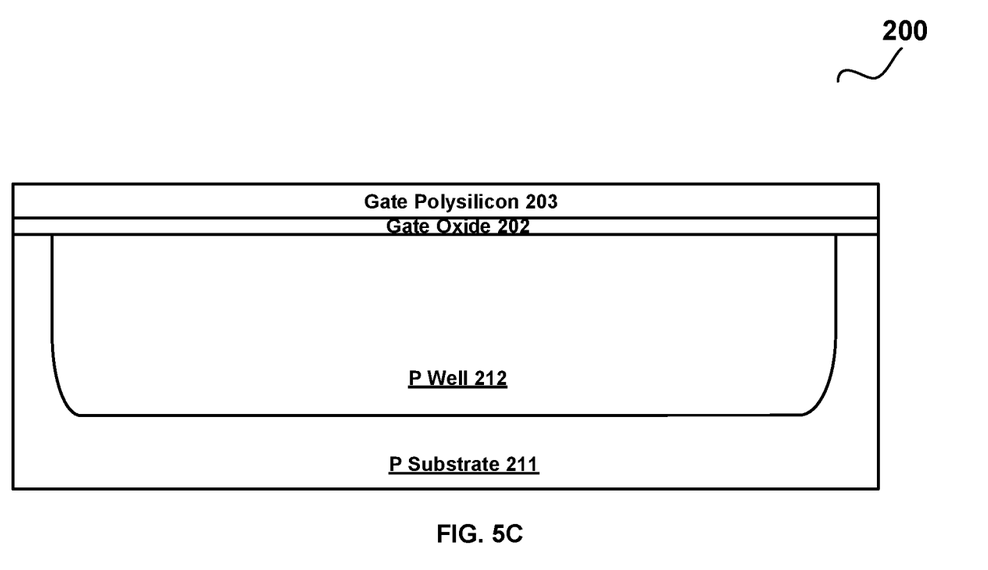

Subsequently, referring to FIG. 5B and FIG. 5C, a gate oxide layer 202 is formed atop the semiconductor substrate, and polysilicon is then deposited to form a gate polysilicon layer 203 on the gate oxide layer 202. The gate polysilicon layer 203 here could be undoped, or lightly doped, as long as its doping concentration is low enough that the following N+/P+ implants steps could counter-dope it.

Figure 5D:
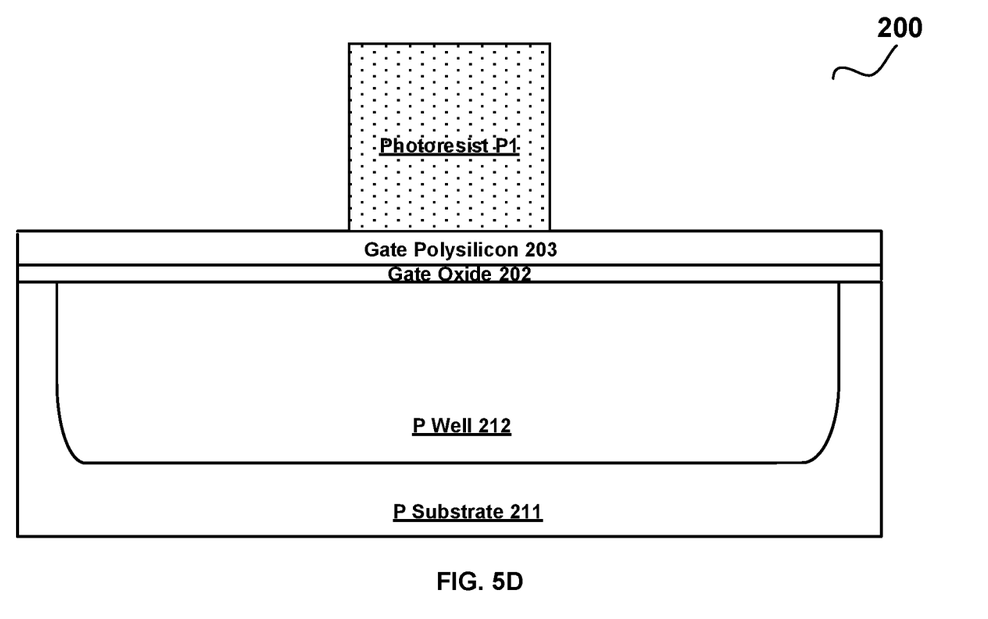
Figure 5E:
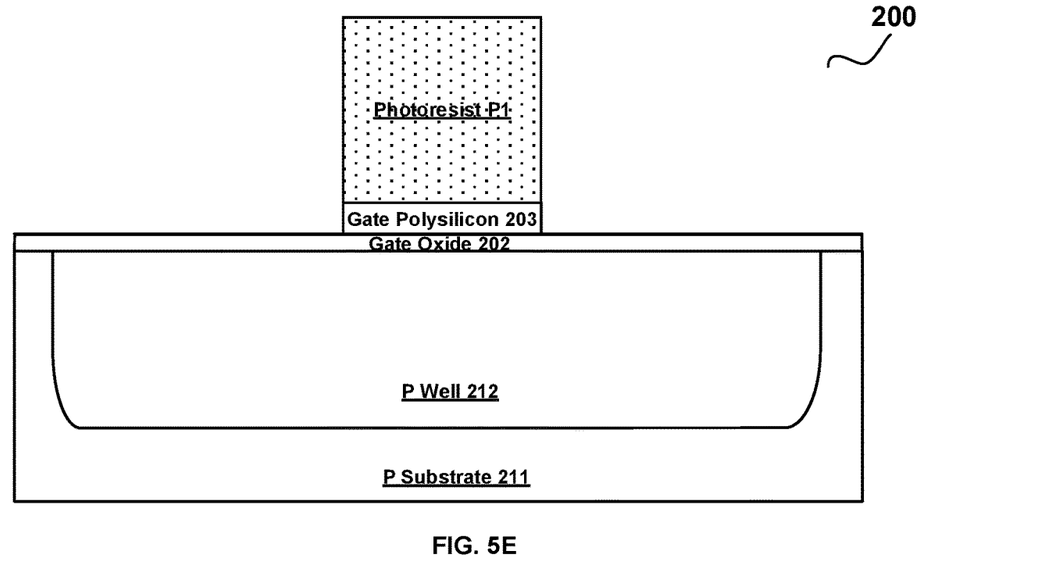

Then, as can be seen from FIG. 5D, a photoresist layer P1 is formed on the gate polysilicon layer 203 and then patterned using a first mask. Afterwards, in the step shown in FIG. 5E, the gate polysilicon layer 203 is etched through the photoresist layer P1 to form a gate polysilicon region.

Figure 5F:
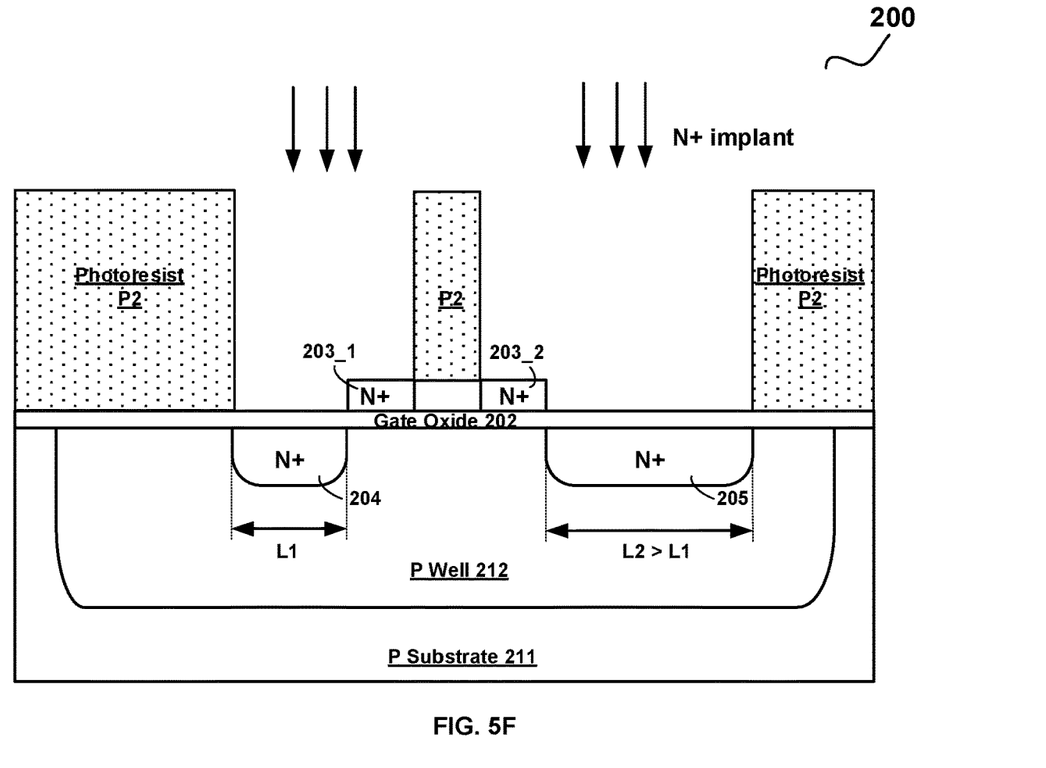

After removal of the photoresist layer P1, in the step of FIG. 5F, a photoresist layer P2 is deposited and then patterned through a second mask, to form a first opening and a second opening respectively at a first side of gate polysilicon region and a second side of the gate polysilicon region. The first and second openings both expose a portion of the gate polysilicon region and a portion of the P well 212. Then N type ion implants (donor ions such as phosphorus and arsenic) is done through the first and second openings, to form a source region 204 in the P well 212, a drain region 205 in the P well 212, a sub-region 203_1 within the gate polysilicon region and laterally adjacent to the source region 204, and a sub-region 203_2 within the gate polysilicon region and laterally adjacent to the drain region 205. By doing so, the sub-region 203_1 and source region 204 are self-aligned, the sub-region 203_2 and the drain region 205 are self-aligned. In the embodiment shown in FIG. 5F, the second opening is designed to be larger than the first opening, and the drain region 205 has a length (L2 as illustrated in the FIG. 5F) greater than that of the source region 204 (L1 as illustrated in the FIG. 5F). Dimension enlargement of the drain region could increase the ballast resistance in the NMOS. Due to the huge discharging current in ESD events, current crowding has been known to cause serious impact on ESD MOS. By increasing the ballast resistance in the ESD MOS, ESD current path can be spread deeper into the substrate of large volume, which, in turn, improves ESD robustness.

Because of dopant spreading and side diffusion, the N+ sub-region 203_1 could become slightly, laterally overlapped with part of the source region 204, the N+sub-region 203_2 could become slightly, laterally overlapped with part of the drain region 205. But it could be understood these are only optional and could be different. As in some other embodiments, there might be lightly doped drain (LDD) regions formed and side wall spacers fabricated before the ion implantation of FIG. 5F.

Figure 5G:
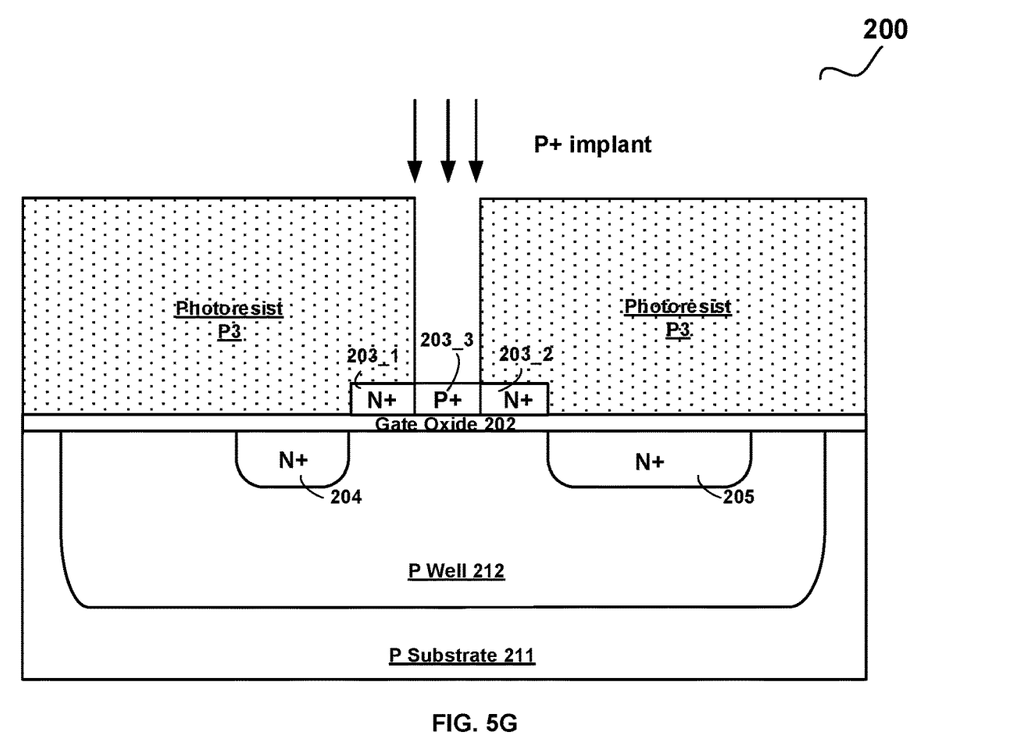
Figure 5H:
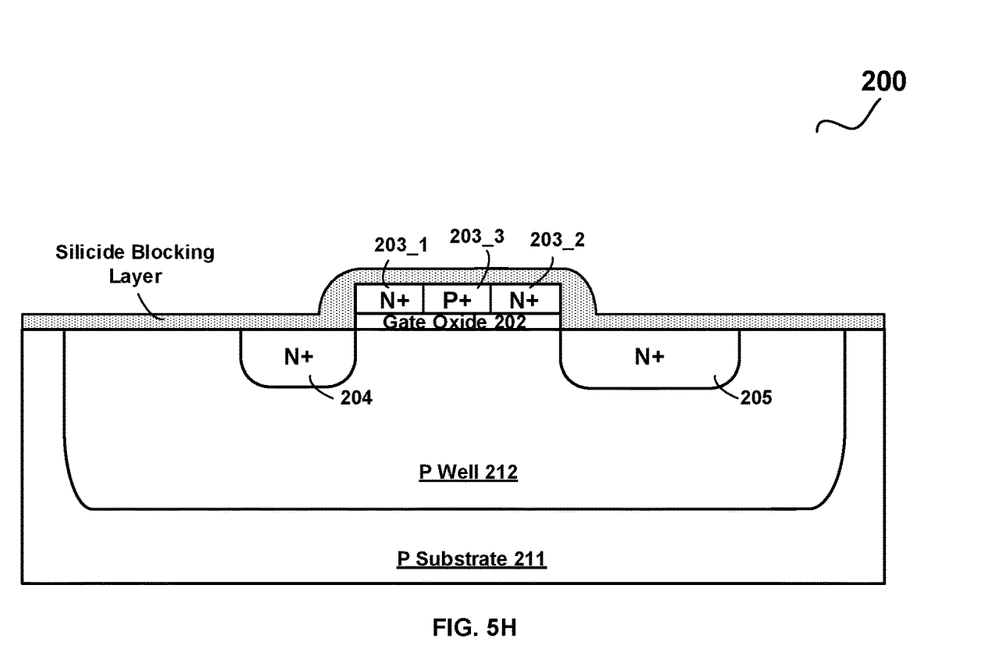

After removal of the photoresist layer P2, as shown in FIG. 5G, another photoresist layer P3 is deposited and patterned through a third mask, to form a third opening with a location laterally between the aforementioned first and second openings. Then P type ions (acceptor ions such as boron and indium) are implanted through this third opening, to form a P+ sub-region 203_3 laterally between the N+ sub-regions 203_1 and 203_2. The photoresist layer P3 is removed after the P type ion implantation. Although in the embodiment described above, the N type ion implantation occurs first, followed by the P type ion implantation, it is obvious to ones skilled the art that these implants could be performed in either order.

In the manufacture of MOS transistors, a commonly-used practice is to form silicide on source/drain regions and on polysilicon gates. To improve ESD performance of the MOS transistor, in some embodiments of the present invention, silicide block is used to create a portion of non-silicided surface in an otherwise silicided region of the MOS transistor. The non-silicide region typically represents a high sheet resistance region, and the silicide region represents a low sheet resistance region. The silicide and non-silicide regions could be formed by photo processing through a patterned silicide blocking mask, followed by photo etching and certain metal etching and annealing processes. As an example, referring now to FIG. 5H, a silicide blocking layer is formed on the semiconductor substrate and the gate polysilicon region. This silicide blocking layer is preferably an oxide layer, for example, an undoped silicon dioxide ($SiO_2$) layer.

Figure 5I:
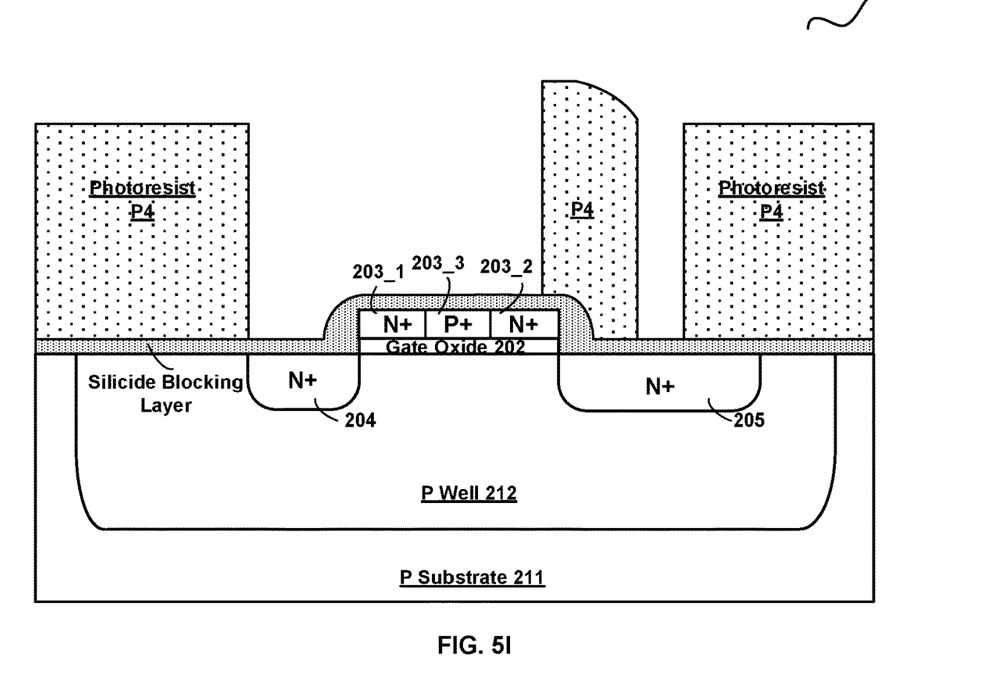

Afterwards, as shown in FIG. 5I, a photoresist layer P4 is further deposited. The photoresist layer P4 is patterned through a fourth mask, to expose the silicide blocking layer above the regions selected to be silicided. Then, in the step of FIG. 5J, the exposed silicide blocking layer is removed, e.g. through an etching method. Thereafter, the photoresist layer P4 is also removed. The regions covered by the remained silicide block will be prevented from silicidation during the subsequent processes.

Figure 5J:
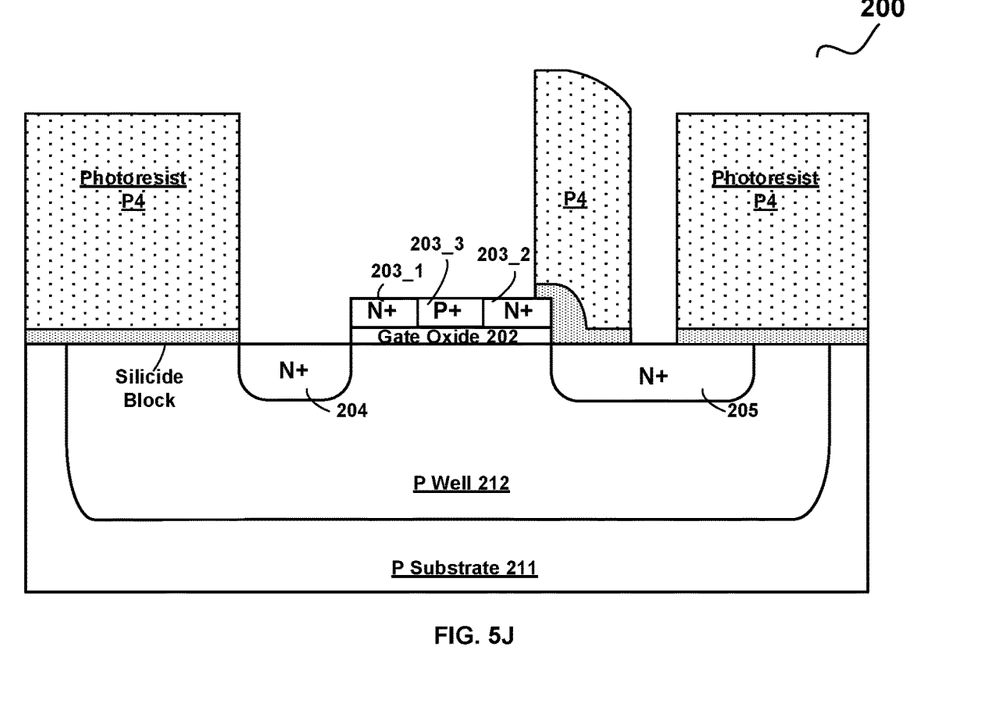

In the exemplary embodiment shown in FIG. 5J, the source region 204, the N+ sub-region 203_1, P+ sub-region 203_3, part of the N+ sub-region 203_2, and a central portion of the drain region 205 are exposed, while the silicide block covers an outer portion of the drain region 205 surrounding the central portion, and extends with an overlap over the sub-region 203_2. However, it should be understood by persons of ordinary skills in the art that, this is just for illustration purpose and not intended to limit the present invention. The silicide block could extend further, to the point of even overlapping the entire polysilicon gate or less to the point of having a gap between to the polysilicon gate. These modifications and variations are all within the scope of the present disclosure and do not depart from the spirit of the invention.

Figure 5K:
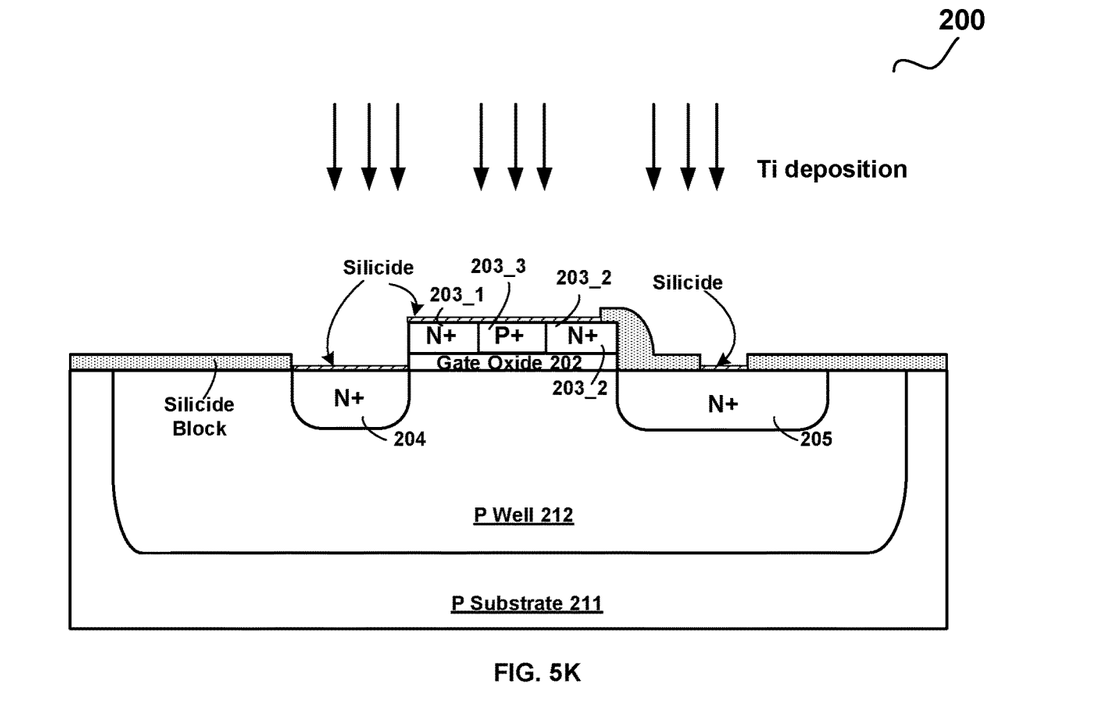

As a next step, a silicide process is performed as shown in FIG. 5K. There are various ways of forming a silicide layer. In one exemplary embodiment, the silicide layer is formed by first depositing a metallic layer, for example, titanium (Ti) or Cobalt (Co), and then performing an annealing operation. At a high temperature, the metal in the metallic layer reacts with the silicon layer below to form a silicide layer, for example, a titanium silicide ($TiSi_2$) layer or a cobalt silicide ($CoSi_2$) layer. For the regions covered by silicide block, the contact between the metallic layer and the silicon layer is separated, thus silicidation is prevented. The unreacted metal is then removed through chemical etching.

Figure 5L:
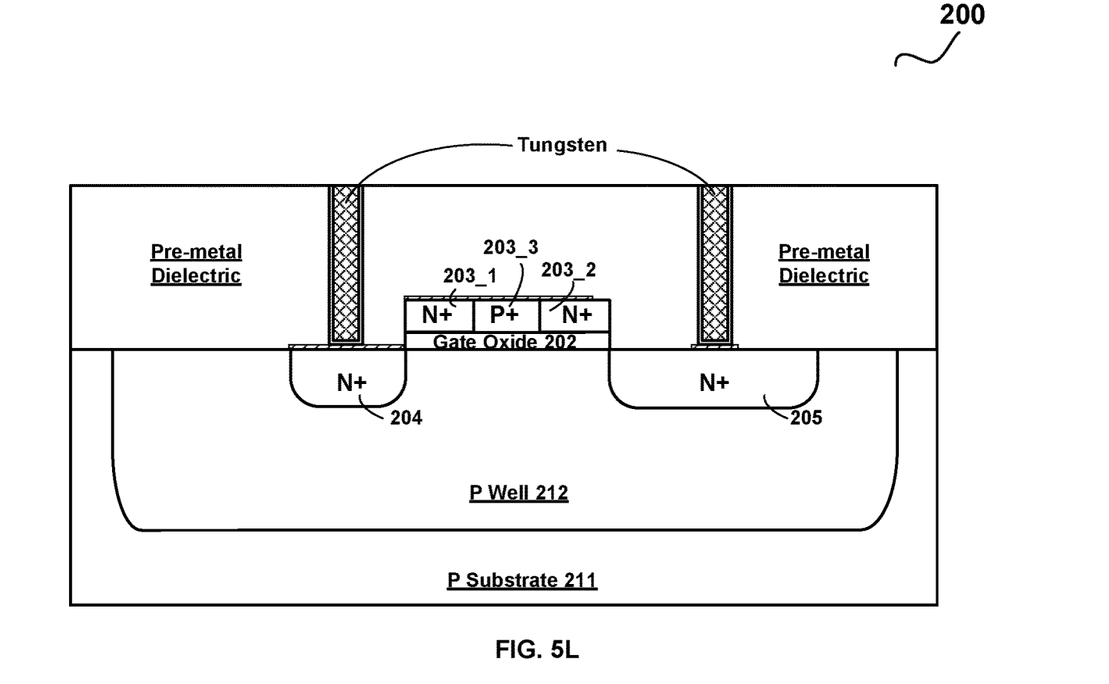

After the silicide procedure, the process continues as usual, including contacts formation and backend. FIG. 5L shows the NMOS 200 after tungsten plug contact formation.

Figure 6:
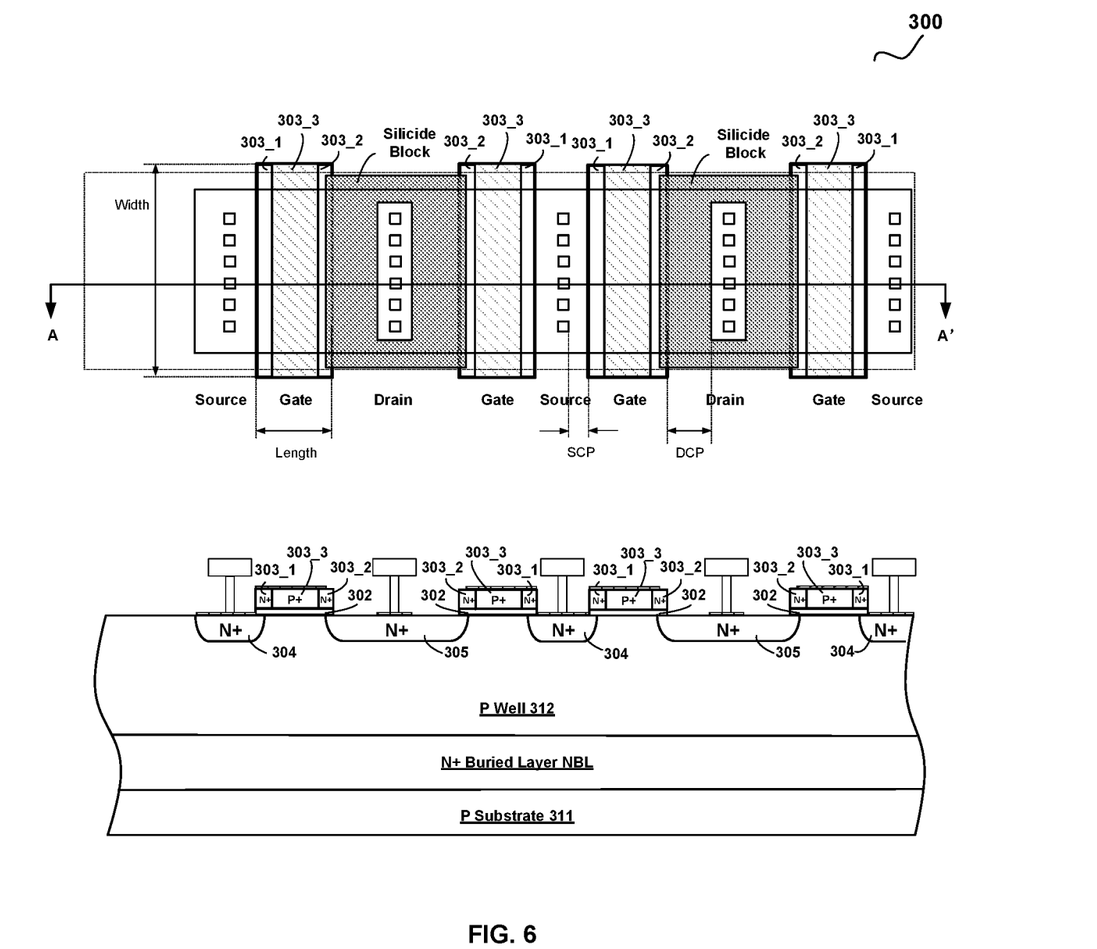
FIG. 6 illustrates a top plan view and a cross-sectional view of an NMOS 300 in accordance with an embodiment of the present invention.

To offer high current-carrying capability within small die area, ESD MOS transistors are usually laid out in multi-finger shape, with source and drain stripes alternating. FIG. 6 illustrates a top plan view and a cross-sectional view of an NMOS 300 in accordance with an embodiment of the present invention. In the NMOS 300, there are a plurality of N+ source regions (304) and N+ drain regions (305) alternatively formed in a P well 312. This P Well 312 is formed in a P type substrate 311, and could be surrounded and isolated from the substrate through an N+buried layer 311.

A plurality of gate oxide regions (302) are formed atop the semiconductor substrate, wherein each of the plurality of gate oxide regions is formed laterally between a corresponding one of the plurality of source regions (304) and a corresponding one of the plurality of drain regions (305). The NMOS 300 also includes a plurality of gate polysilicon regions, wherein each of the plurality of gate polysilicon regions is formed on a corresponding one of the plurality of gate oxide regions (302), and includes N+ sub-regions 303_1, 303_2, and a P+ sub-region 303_3. The N+ sub-region 303_1 is laterally overlapped with part of the corresponding source region (304), the N+ sub-region 303_2 is laterally overlapped with part of the corresponding drain region (305). The P+ sub-region 303_3 is formed laterally between the N+ sub-regions 303_1 and 303_2.

It should be known that the sub-regions of the gate polysilicon region do not have to be evenly distributed, which means, they could have different length. For example, in one embodiment of the present invention, the N+ sub-regions 303_1 and 303_2 both have a length of 0.25 um, the P+ sub-region 303_3 has a length of 1.5 um. The silicide block extends with a minimum overlap 0.06 um over the N+ sub-region 303_2 on the drain side. The DCP (drain contact to polysilicon gate) dimension is 2.18 um, while the SCP (source contact to polysilicon gate) dimension is 0.16 um.

To provide ESD protection for an integrated circuit device, the plurality of drain regions are electrically coupled (through contacts and metal) to a first pad (e.g. I/O pad) of the integrated circuit device, while the plurality of source regions are electrically coupled to a second pad (e.g. VSS pad) of the integrated circuit device. In one embodiment, the NMOS 300 is configured as a GGNMOS, and the plurality of gate polysilicon regions are also electrically coupled to the aforementioned second pad.

Figure 7:
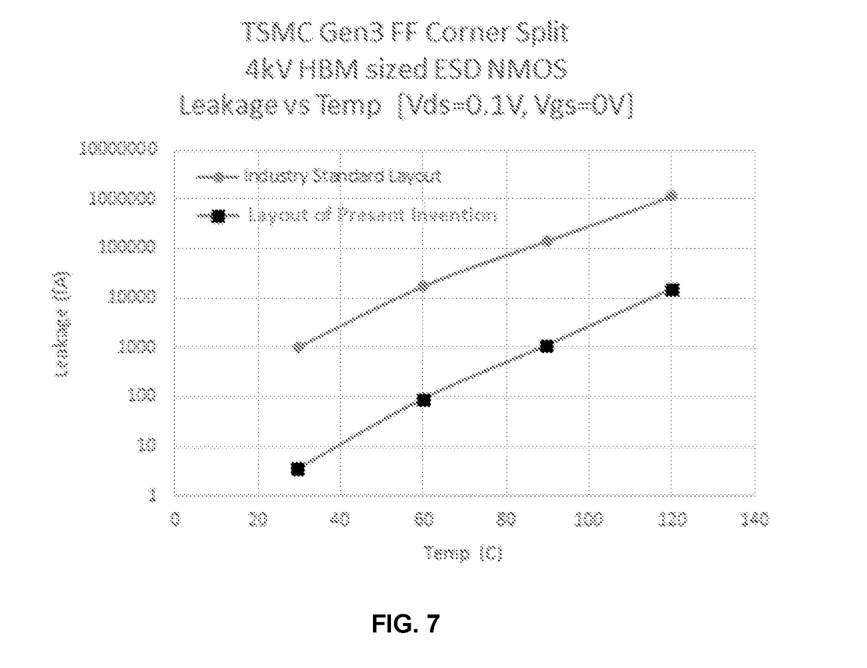
FIG. 7 is diagram showing relationship between leakage current and temperature of a ESD NMOS under 4 kV HBM ESD test, respectively using industry standard layout and the layout of FIG. 6.

Compared with the industry standard layout, the layout of FIG. 6 could shift\ the threshold voltage Vth of the NMOS positively for almost 1V, for example from +0.7V to +1.7V, with corresponding reduction in the subthreshold current $I_{sub}$ of 10 orders ($10^{10}$) of magnitude (typical subthreshold slope being 100 mV/decade). Due to reverse-bias PN junction leakage and possibly other leakage paths, the final leakage probably won't be 10 orders of magnitude lower. FIG. 7 is diagram showing relationship between leakage current and temperature of a ESD NMOS under 4 kV HBM (human body model) ESD test, respectively using industry standard layout and the layout of FIG. 6. As shown in FIG. 7, the leakage current was reduced by almost 250 times at $V_{gs}$=0V.

Obviously many modifications and variations of the present invention are possible in light of the above teachings. For instance, besides the three aforementioned sub-regions, there could be one or more additional sub-regions formed in the gate polysilicon region. These sub-regions could have any suitable doping type. As an example, they could have the same doping status with the gate polysilicon layer originally deposited on the semiconductor substrate (e.g. as in the step of FIG. 5C), before the N+ and P+ ion implantations. Also, the additional sub-regions could be arranged to form a gate polysilicon region with a structure like N+/P+/N+/P+/N+.

Figure 8:
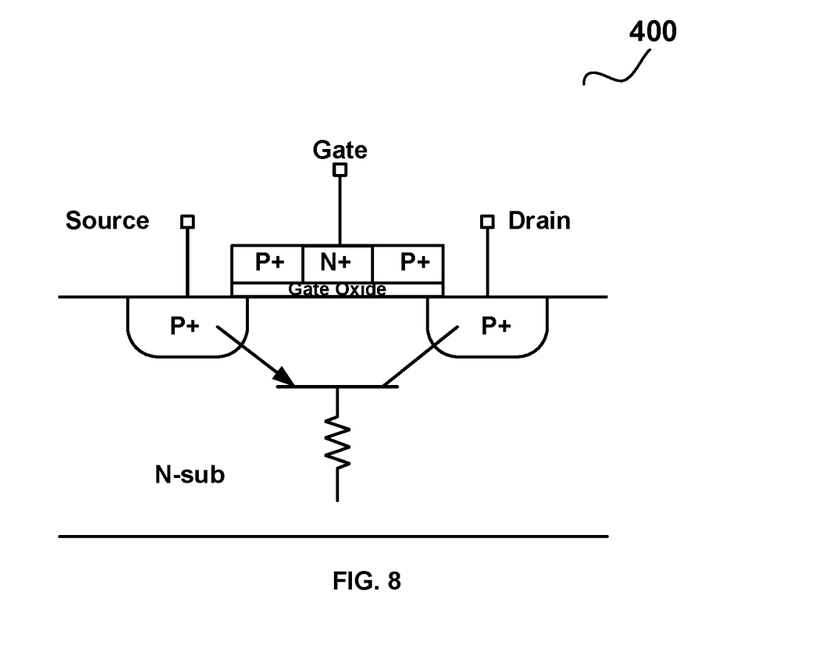
FIG. 8 illustrates a semiconductor structure of a PMOS 400 in accordance with another embodiment of the present invention.

Besides NMOS, it should be known that the present invention also applies to PMOS, such as shown in FIG. 8. When used for ESD protection in integrated circuit devices, the PMOS often has its drain electrically coupled to a power supply pad (i.e. VDD pad) and source electrically coupled to an I/O pad. And when configured as a GDPMOS (Gate-to-VDD PMOS), the gate of the PMOS is also electrically coupled to the VDD pad. However, it should be noted these are not intended to limit the present invention. The NMOS and PMOS transistors in accordance with embodiments of the present invention could be electrically coupled between any suitable pads (e.g. coupled between VDD pad and VSS pad), and configured in any suitable electrical connection schemes (e.g. gate-coupled scheme, non-snapback scheme with triggering circuit coupled to gate, etc.) to provide efficient discharge paths to bypass ESD stress.

It will be appreciated by persons skilled in the art that the present invention is not limited to what has been particularly shown and described herein above. Rather the scope of the present invention is defined by the claims and includes both combinations and sub-combinations of the various features described hereinabove as well as variations and modifications thereof which would occur to persons skilled in the art upon reading the foregoing description and which are not in the prior art.

What is claimed is:

1. A MOSFET fabricated in a semiconductor substrate, comprising:
   a gate oxide region formed atop the semiconductor substrate;
   a gate polysilicon region formed on the gate oxide region;
   a source region of a first doping type formed in the semiconductor substrate and located at a first side of the gate polysilicon region; and
   a drain region of the first doping type formed in the semiconductor substrate and located at a second side of the gate polysilicon region; wherein
   the gate polysilicon region includes a first sub-region of the first doping type, a second sub-region of the first doping type, and a third sub-region of a second doping type, and wherein the first sub-region is laterally adjacent to the source region, the second sub-region is laterally adjacent to the drain region, and the third sub-region is formed laterally between the first and second sub-regions; and wherein
   the MOSFET further comprises a silicide layer formed above a central surface portion of the drain region, wherein an outer surface portion surrounding the central surface portion in the drain region is not covered by the silicide layer.

2. The MOSFET of claim 1, wherein the source region and drain region are formed in a well of the second doping type in the semiconductor substrate.

3. The MOSFET of claim 2, wherein a length of the first and second sub-region are same, and are smaller than the length of the third sub-region.

4. The MOSFET of claim 1, wherein the drain region has a length larger than the source region.

5. The MOSFET of claim 1, wherein the silicide layer is further formed above the gate polysilicon region and the source region.

6. The MOSFET of claim 1, wherein the silicide layer is further formed above the first sub-region, the third sub-region, and part of the second sub-region adjacent to the third sub-region, and wherein part of the second sub-region adjacent to the drain region is not covered by the silicide layer.

7. The MOSFET of claim 1, wherein the MOSFET is used in an integrated circuit device for providing ESD protection, the drain region of the MOSFET is electrically coupled to a first pad of the integrated circuit device, the source region is electrically coupled to a second pad of the integrated circuit device.

8. The MOSFET of claim 7, wherein the gate polysilicon region is electrically coupled to the second pad of the integrated circuit device.

9. The MOSFET of claim 1, wherein the first sub-region is laterally overlapped with part of the source region, the second sub-region is laterally overlapped with part of the drain region.

10. A MOSFET for providing ESD protection in an integrated circuit device, comprising
a plurality of source regions and a plurality of drain regions alternatively formed in a semiconductor substrate and having a first doping type, wherein the plurality of drain regions are electrically coupled to a first pad of the integrated circuit device, the plurality of source regions are electrically coupled to a second pad of the integrated circuit device;
a plurality of gate oxide regions formed atop the semiconductor substrate, wherein each of the plurality of gate oxide regions is formed laterally between a corresponding one of the plurality of source regions and a corresponding one of the plurality of drain regions; and
a plurality of gate polysilicon regions, wherein each of the plurality of gate polysilicon regions is formed on a corresponding one of the plurality of gate oxide regions, and includes a first sub-region of the first doping type, a second sub-region of the first doping type, and a third sub-region of a second doping type; wherein
the first sub-region is laterally overlapped with part of the corresponding source region, the second sub-region is laterally overlapped with part of the corresponding drain region, and the third sub-region is formed laterally between the first and second sub-regions; and
wherein the MOSFET further comprises a silicide layer formed above a central surface portion of each of the plurality of drain regions, wherein an outer surface portion surrounding the central surface portion in each of the plurality of drain regions is not covered by the silicide layer.

11. The MOSFET of claim 10, wherein the plurality of gate polysilicon regions are electrically coupled to the second pad.

12. The MOSFET of claim 10, wherein the semiconductor substrate comprises an original substrate of the second doping type, a buried layer of the first doping type, and a well of the second doping type.

13. The MOSFET of claim 10, wherein each of the plurality of drain regions has a length larger than each of the plurality of the source regions.

14. The MOSFET of claim 10, wherein a length of the first and second sub-region are same, and are smaller than the length of the third sub-region.

* * * * *